United States Patent [19]

Rothenberger

[11] Patent Number: 5,462,440
[45] Date of Patent: Oct. 31, 1995

[54] MICRO-POWER CONNECTOR

[76] Inventor: Richard E. Rothenberger, 5 State Dr., Harrisburg, Pa. 17112

[21] Appl. No.: 212,635
[22] Filed: Mar. 11, 1994
[51] Int. Cl.⁶ ................................................. H01R 9/09
[52] U.S. Cl. ................................ 439/66; 439/65; 439/81
[58] Field of Search .................................. 439/66, 65, 91, 439/885, 660

[56] References Cited

U.S. PATENT DOCUMENTS

| | | | |
|---|---|---|---|
| 3,883,213 | 5/1975 | Glaister . | |
| 4,634,199 | 1/1987 | Anhalt et al. . | |
| 4,699,593 | 10/1987 | Grabbe et al. | 439/71 |
| 4,806,104 | 2/1989 | Cabourne | 439/66 |
| 4,927,369 | 5/1990 | Grabbe et al. | 439/66 OR |
| 4,998,886 | 3/1991 | Werner | 439/66 OR |
| 5,015,191 | 5/1991 | Grabbe et al. | 439/71 |
| 5,137,456 | 8/1992 | Desai et al. | 439/66 |
| 5,139,427 | 8/1992 | Boyd et al. | 439/66 |
| 5,152,695 | 10/1992 | Grabbe et al. | 439/71 |
| 5,167,512 | 12/1992 | Walkup | 439/66 OR |
| 5,167,543 | 12/1992 | Wurster | 439/885 X |
| 5,173,055 | 12/1992 | Grabbe | 439/66 |
| 5,228,861 | 7/1993 | Grabbe | 439/66 OR |
| 5,324,205 | 6/1994 | Ahmad et al. | 439/66 OR |

Primary Examiner—David L. Pirlot
Assistant Examiner—Daniel Wittels
Attorney, Agent, or Firm—June Schuette; Timothy Aberle

[57] ABSTRACT

A process for manufacturing a housed metallic contact connector (1) for interconnecting electronic devices (17) comprising: (a) stamping from a conductive metal strip (7) a contact connector array (8), placing said contact connector array (8) into a mold, and injection molding directly around the contact connector array (8) a plastic to form an integral housing (4) directly around the stamped contact connector array (8). A plastic housed contact connector (1) forms part of the disclosed invention. Also forming part of this invention is a metallic array (8) with an aperture (11) to more efficiently bind plastic to the housing (4).

7 Claims, 5 Drawing Sheets

MICRO-POWER CONNECTOR

FIELD OF THE INVENTION

This invention relates to connectors for joining electronic components on parallel facing surfaces, and more particularly to a single unit connector.

1. Background of the Invention

Printed circuit boards are widely used in a broad range of products in commerce, examples of which are radios, TV's, VCR's, watches, timers and computers. The printed circuit boards come in a wide array of sizes and shapes.

Printed circuit boards, as well as, other electronic components in many instances are electronically joined through connectors. The components are typically interconnected to define a given function through a printed circuit board having contact pads complimentary to pads of the components to which printed circuit board is to be joined in planar disposition. Thus, connectors for integrated circuit chip carriers must be manufactured so that the contact members of the connector will contact pads on the printed circuit board and other components when they are assembled in planar disposition.

Connectors are manufactured with distinct needs in mind. Some examples of special needs will be set forth below with the invention herein described addressing some of these needs.

Connectors are manufactured with distinct requirements of contact force ranging from low closure force, to intermediate force, to those requiring rigorous application in the form of a coil spring. Special needs such as environment of use, vibration and stress must be kept in mind. Redundancy of contact and wipe between the contact points and the contact pads are important. Wipe is necessary to rid the pad and contact point of oxidation and other corrosion on their surfaces. The connectors can be formed, depending upon need, of materials such as stainless steel, beryllium, copper, phosphor bronze as well as various alloys thereof. On the contact points, finishes such as gold over nickel and finishes providing low resistance may be employed.

In an effort to produce extremely high speed computers the size of the electronic devices used therein has become more miniaturized, so that now there is a need to provide a means to connect an extremely large number of contacts in a small space. Integrated circuit components may have hundreds of contact pads located on close centers, for example, 0.050 inch centers for use in computers, communication equipment and the like. In various applications the number of circuit boards necessary for certain operations may number several dozen. Space considerations are of importance and it is generally desirable to engineer as many circuit boards as possible in a minimum amount of space. Because of miniaturization, the height of components when mounted on a printed circuit board must be kept to a minimum.

Recognizing the need to eliminate parts and components when manufacturing electronic devices and the need to miniaturize the components involved with printed circuit board technology, as well as, the need to develop a dependable connector, efficiently, reliably and economically, the inventor has produced the connector of this invention.

2. Prior Art

Grabbe et al in U.S. Pat. No. 5,152,695 shows a connector for connecting a circuit between electronic devices employing cantilevered spring arms, the arms supply redundancy by compound wipe during deflection. The connector array shows the connectors each as an integral unit rather than integrated as a single unit and no plastic housing surrounds the connectors.

U.S. Pat. No. 4,806,104 to Cabourne shows a high density electrical connector employing a stack of insulative strips. The connector is V-shaped and resilient. The ends of the V contact the pads on the surface of the circuit boards, with the resiliency of the V-shaped connector being able to make more efficient contact on the irregular contours on the surface of the electronic printed circuit board. The contacts of the Cabourne device are not formed in a single integrated unit, but each connector is individual.

Grabbe in U.S. Pat. No. 5,173,055 shows a cantilevered area connector array which can be prepared by stamping (col. 2, line 1) from a sheet of metal in a roll. Also shown by Grabbe is an insulating laminate through which the contact fingers protrude; as well as an embodiment wherein the contact fingers are bent one up and the other bent down to engage a circuit area on an underlying electronic device (col. 3, line 18 etc.). Not shown by Grabbe is an injection insert molding to mold the plastic housing directly to the connector.

Grabbe et al in U.S. Pat. No. 4,699,593 shows a connector which can be produced by stamping. An advantage of the connector device disclosed is that a wide variety of connectors can be produced at greatly reduced tooling cost because a variety of modules can be used with a standard housing frame. The advantage of the system disclosed by Grabbe et al is that the module locating the individual modules in the housing frame and the substrate locating means for locating the substrate on the housing frame are directly related to each other. They are related to one another by a common reference point in that the keyways which locate the substrate on the housing frame and the keyways which locate the modules in the housing frame are determined from a common reference point when the housing frame is manufactured. The parts which are assembled to the housing frame, the modules and substrate are brought into registry with each other by the commonality of the locating or keying system which locate these parts on the frame. The patent to Grabbe et al uses a sandwich method for stacking components.

U.S. Pat. No. 4,634,199 to Anhalt et al show a connector assembly for interconnecting conductors to circuit boards or panels. The connectors are V-shaped and spaced in rows. They may be formed from sheet metal by stamping and they may be made of a conductive material such as phosphor bronze. The connectors of Anhalt et al are not made as a single integral unit.

Grabbe et al in U.S. Pat. No. 5,015,191 disclose a connector between two dielectric surfaces which is then placed in engaged position to contact pads on a printed circuit board and integrated circuit package. The contact members can be positioned between layers of dielectric film which film comprises two relatively thin and flat pieces with appropriate apertures and locating recesses for accommodating the contact members. The pieces can be snap-fit together (col. 5, line 26 etc.). Other ways of joining the cover member and clamp member involve nuts and bolts through suitable apertures or mechanical means such as a clamp to fix the cover member into its proper position relative to the base member.

U.S. Pat. No. 5,139,427 to Boyd et al disclose an electric connector for interconnecting contact pads of components.

The connector has rounded spring-like contacts which afford good wipe and good contact. The contacts are positioned to give both top and bottom contact.

In short none of the prior art shows a connector device housed in a low height contact connector with an injection insert molding which molds the housing directly to the connector.

OBJECTS OF THE INVENTION

It is an object of this invention to produce a reliable printed circuit board connector for interconnecting a printed circuit board pad array to another active component.

A further object is to produce a micro-power connector economically and efficiently.

Another object of this invention is to produce a device which eliminates parts.

A still further object of this invention is to produce a device which is not space consuming.

An additional object of this invention is to produce a connector which makes efficient contact between components.

SUMMARY OF THE INVENTION

The present invention is designed to efficiently produce a micro-power connector, which is of an optimal height and size to function in printed circuit board technology. The invention eliminates the need for multiple insulating sheets by injection insert molding a single plastic housing around the metallic connector array. The components of this connector are fixed. Specifically, the connector is firmly fixed to the plastic of the housing, and therefore will not become distorted and lose contact due to vibration or rough usage. Moreover, the housed connector is designed to make efficient contact with pads on the electronic devices to be joined.

The connectors of this invention are economical to produce in high volume because the process of preparation starts with a metallic strip from which the metallic portion of the connector is stamped. In the stamping process an unlimited number of metallic connector subassemblies are stamped serially with the subassemblies being held together on the strip through tabs. The plastic housing is formed around the metallic subassembly while the subassembly is still attached to the strip. After the housing is formed around the array, the contact fingers or contact points within the housed array are cantilevered to point in opposite directions using a profile punch. The strip with the housed arrays can be rolled onto a reel and sent to various users where the individual housed connectors are severed from the strip for use. Alternatively, the housed arrays can be singulated, that is severed during the manufacturing operation and individual housed connectors themselves used in-house or shipped individually to other users. It is readily apparent that the process of this invention lends itself to ease of mass production and shipment and/or immediate in-house use of the final product.

The metallic part or metallic subassembly of the connector at each quadrant has two oppositely cantilevered contact fingers or points and a circular aperture which aperture is filled with plastic during overmolding and provides enhanced retention of the metal contacts within the overmolded plastic body. The plastic which forms the overmolded body makes substantial contact over the top and bottom planes of the metallic portion of the connector and in effect becomes a unified body around the metal contact points. It goes without saying that this single unit contact array in its injection molded plastic housing is a marked advance over the prior art connector which required a three piece assembly and necessary guide means for proper positioning of contact points and locking means to keep the parts together.

The metallic connector array is formed of a conductive material wherein the members of the array are joined and are catercornered from each other, with each member of the array in its quadrant and each member of the contact array having a pair of contact fingers able to be cantilevered to point in opposite directions. The contact connector array is contained in a plastic housing which has been injection insert molded around the metallic connector array. While the preferred conductive metal for the connector is beryllium copper, other conductive metals well known to those skilled in the art would be operative. The contact array is preferably formed from a metal strip by stamping, however other means of separating such as laser cutting or chemical milling could be employed. In its final use the contact points on the connector will contact pads on an electronic device.

The housed connector of this invention is of low height or profile which is advantageous in view of the trend toward miniaturization. In its optimum dimensions the connector has an overall height of from 0.052 of an inch with the contacts fully extended and a height of 0.036 of an inch for the main body of the housing. The optimum planar dimension of the contact connector in the housing is a square of 0.189 of an inch on each side and the thickness of the metallic portion of the connector is 0.008 of an inch.

Because of their flexibility the contact points of this invention offer positive contact wipe, easy field replaceability without the need for special tools or the need to unsolder and solder connections. The connector of this invention offers the option of selection between many different metallic contact surfaces with beryllium-cooper being preferred. In an especially preferred embodiment the beryllium-copper strip is plated with a nickel plating and then with a tin-lead plating.

A dielectric polymer is used for the injection molded housing of this invention. Specifically, "Vectra", a liquid crystal polymer, composed wholly of aromatic co-polymers. This polymer has low viscosity and good flow into interstices prior to becoming solidified. "Vectra" can be obtained from the Celenese Corporation. The injection molding process is carried out at 2000 to 6000 PSI.

GENERAL DESCRIPTION OF THE PREFERRED EMBODIMENT

Figure 1:
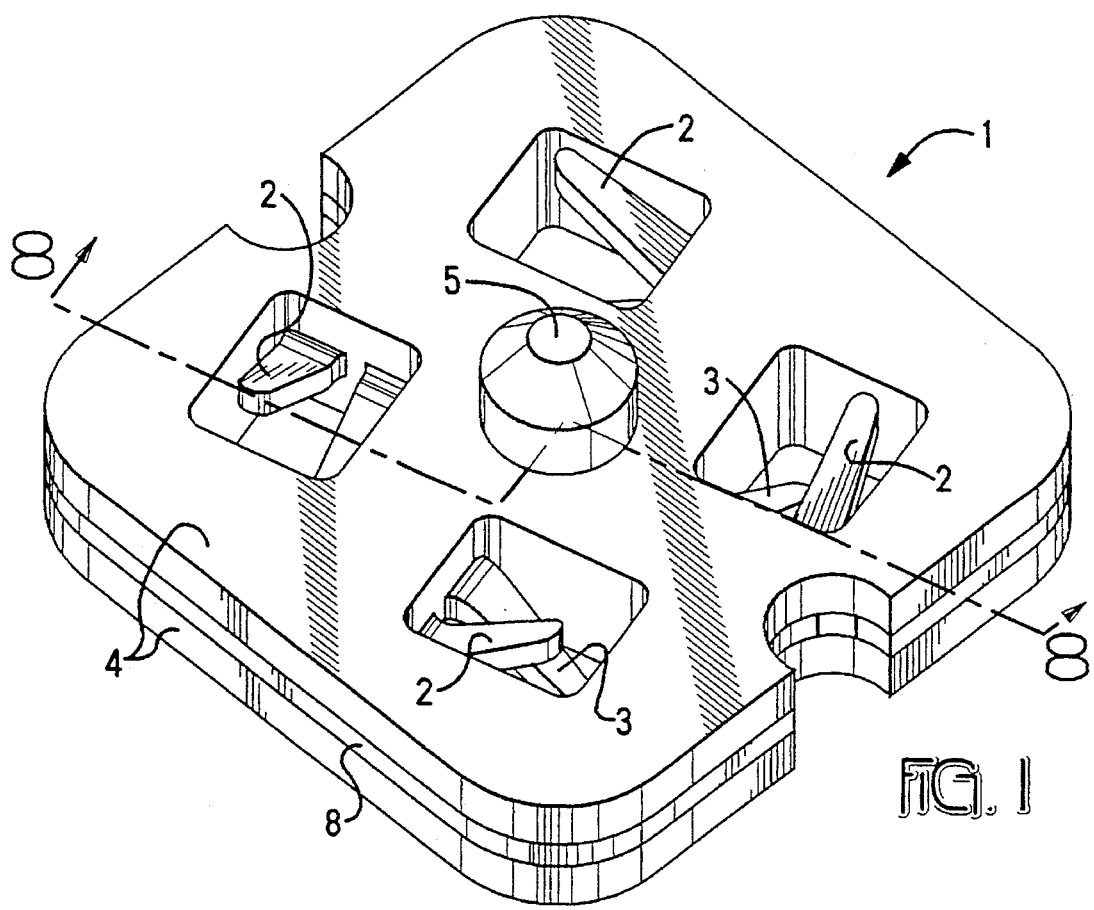
FIG. 1 is a top perspective view of a housed metallic connector array showing the metallic connector contacts enclosed in the plastic housing.

With reference to FIG. 1 there is illustrated the housed contact connector 1 of the present invention wherein 2 represents contact fingers of the present invention cantilevered to make contact above the housing 4 with 3 representing contact fingers cantilevered to make contact below the housing. The injection molded plastic housing is shown by 4 which can be made of any suitable plastic. The guide post 5 is shown on top of the housing 4.

Figure 2:
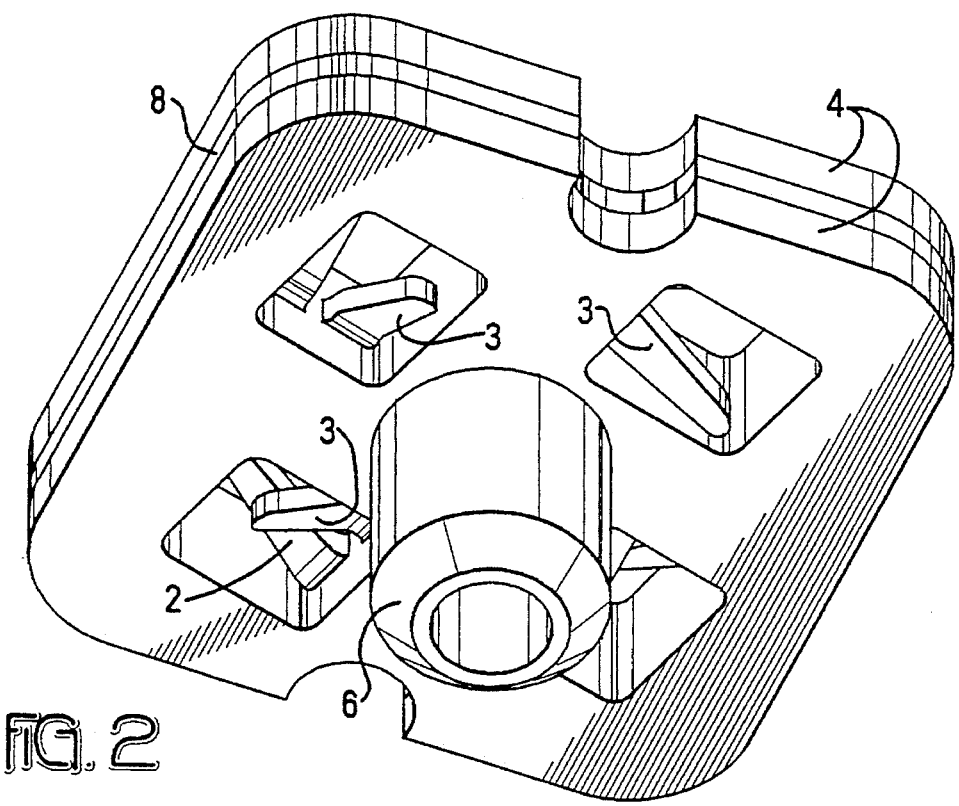
FIG. 2 is a bottom perspective view of the housed metallic connector array shown in FIG. 1.

With regard to FIG. 2 there is shown a bottom view of the contact connector 1 shown in the plastic injection molded housing 4 with 6 showing the bottom guide.

With reference to FIGS. 3–9 there are shown figures representing the method of manufacturing the housed connector.

Figure 3:
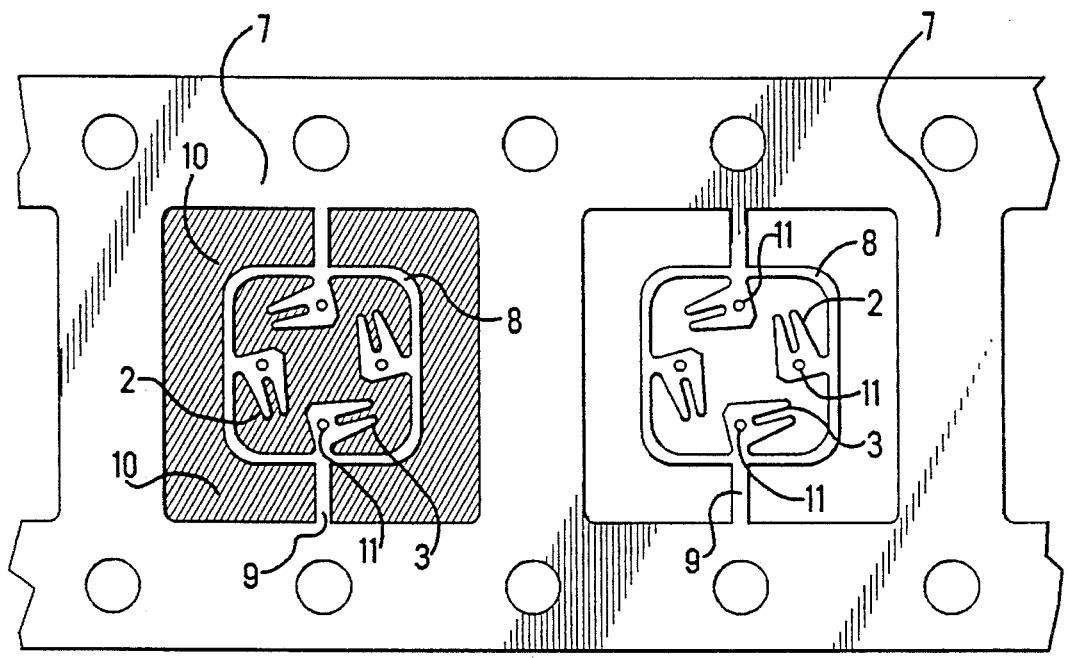
FIG. 3 is a plan view of the metal contact array shown during manufacture with the array being attached to the metal strip by side tabs, the shaded area showing the metal which is cut away during the manufacture of the connector array.
Figure 4:
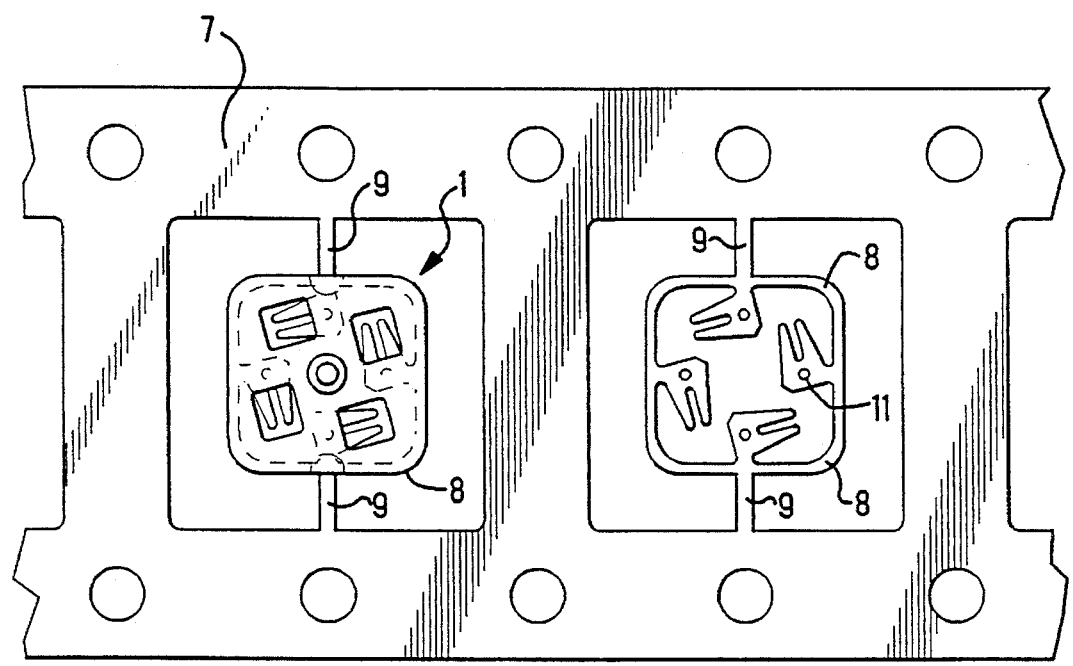
FIG. 4 is a plan view of a metal strip of contact arrays with one of the arrays shown housed, the dashed lines representing the metal part of the connector hidden beneath the plastic housing.
Figure 5:
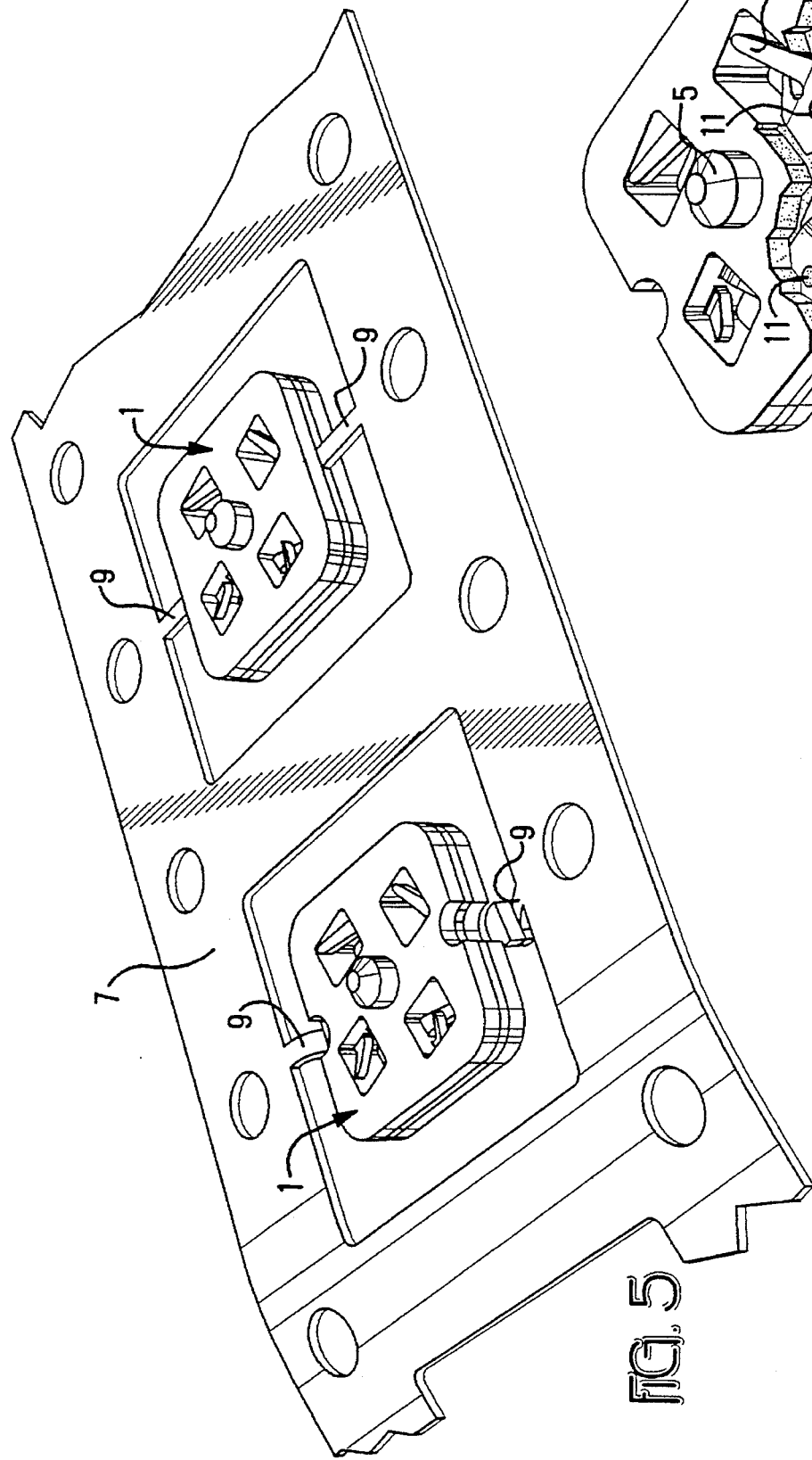
FIG. 5 is a perspective view of the housed connector arrays on the metal strip with one of the housed arrays being severed from the strip.
Figure 6:
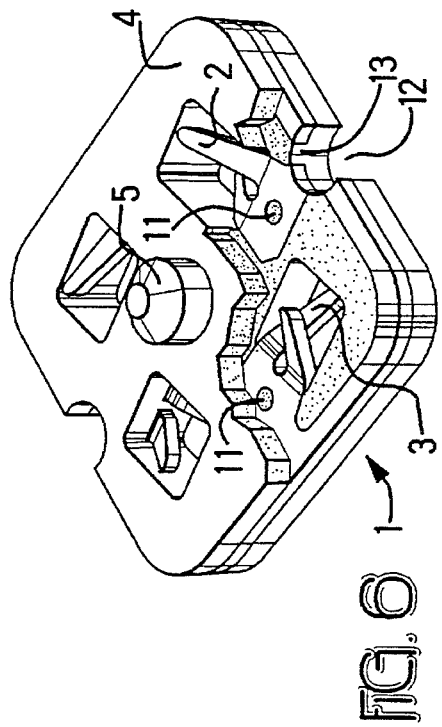
FIG. 6 is a perspective view of a housed contact array with part of the housing broken away to show detail of how the contact fingers are cantilevered and the flow through aperture.
Figure 7:
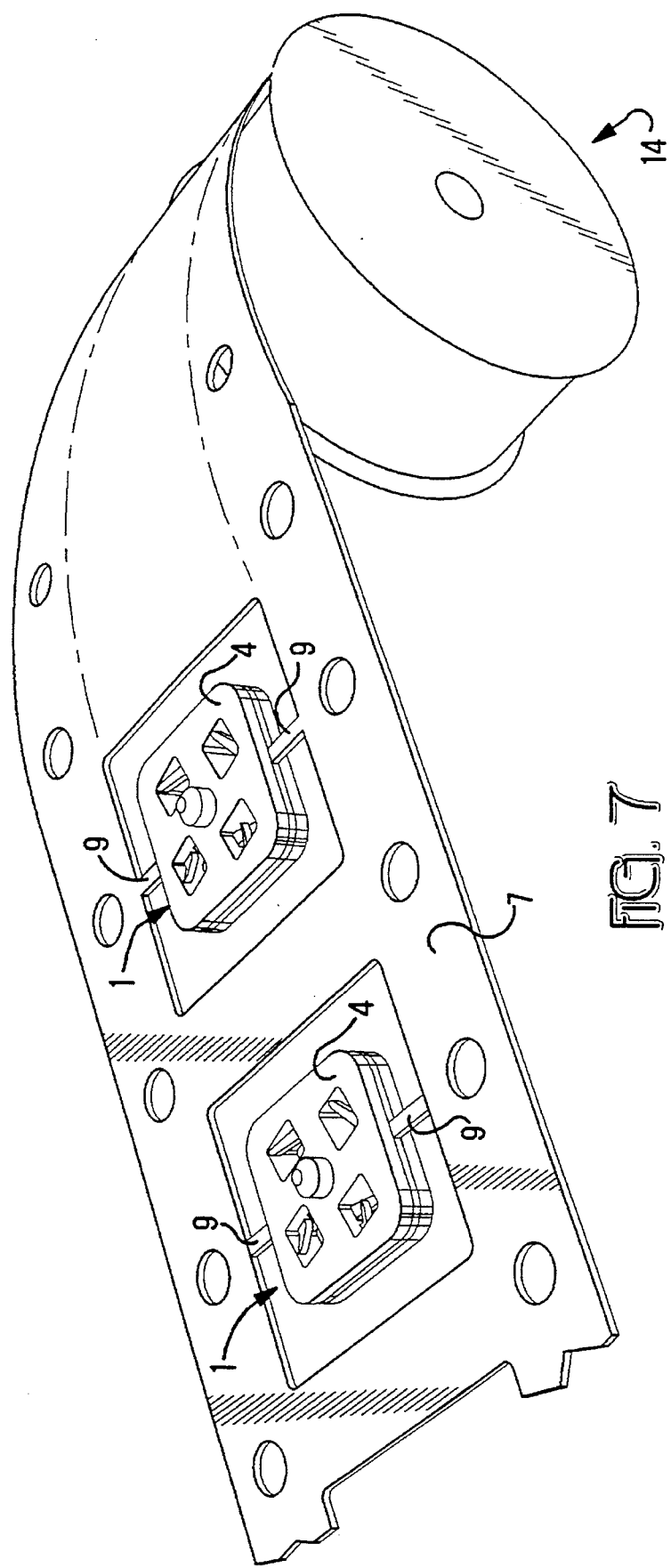
FIG. 7 is a perspective view of a reel showing two plastic housed connectors, one of which has been severed from the reel.
Figure 8:
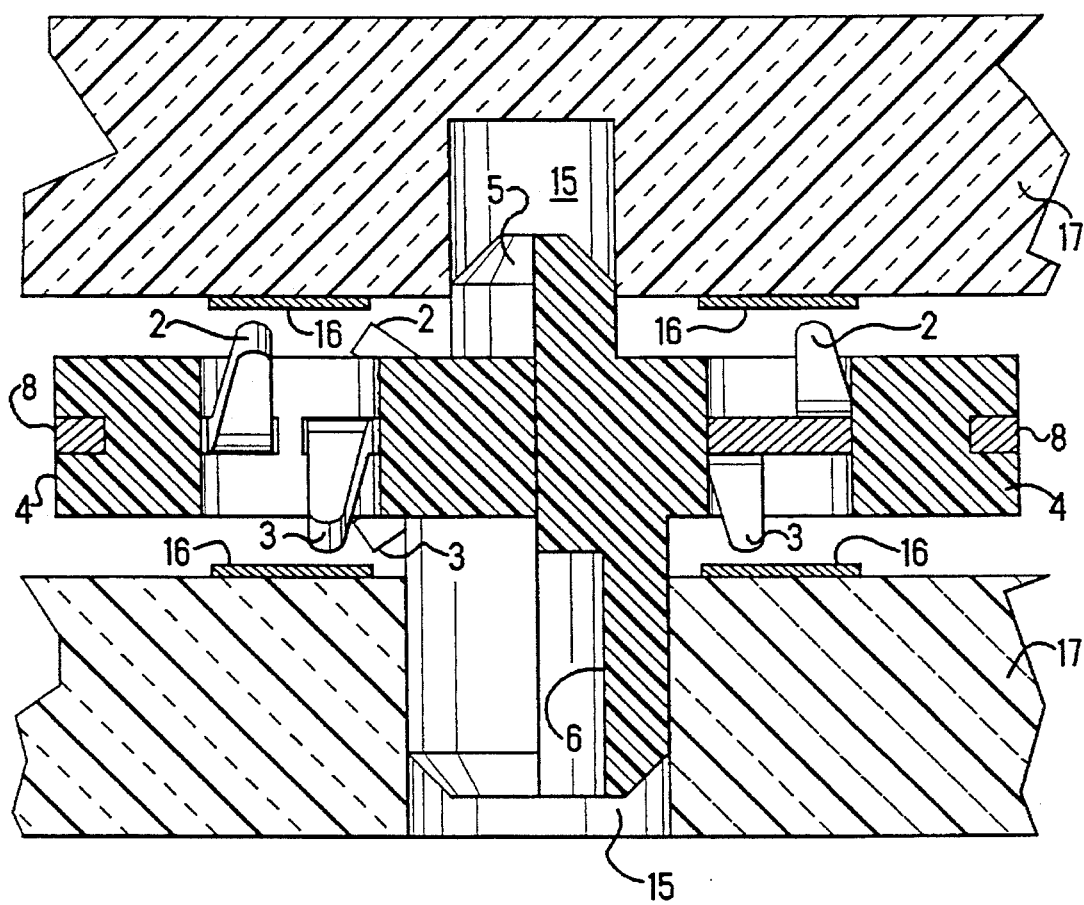
FIG. 8 is a cross-sectional view of the housed connector array taken along lines 9—9 of FIG. 1 shown with the electronic appliances to which the connector is attached being shortened.

In manufacture, a conductive strip 7, as for example, beryllium-copper is stamped to produce a four position contact array 8 shown in FIG. 3. The array is attached to the metal strip 7, from which it was stamped, by tab 9. In FIG. 3 the shaded area 10 represents the metal removed during stamping. Also shown in FIG. 3 are the apertures 11 through which plastic flows to more securely bind the contact array to the plastic housing. Once the metallic array 8 is stamped and the excess metal 10 removed, the strip 7 is placed into a mold and injection molded with plastic to form a housing 4. FIG. 4 shows a metallic strip 7 with one four-position contact array 8 unhoused and the other metallic array housed. The dashed lines show the outline of the metallic array 8 under the housing 4. After the metallic array is housed the contact fingers 2 and 3 are cantilevered in opposite directions. Regarding FIG. 5 there is shown cantilevered contact points 2 and 3 and the housed array 1. One of the housed arrays 1 is still attached to the metallic strip 7 and the other housed array has been singulated (that is severed) from the strip at the notched semi-circle area 12. Referring now to FIG. 6 there is shown the housed micro-power connector 1 of this invention with a portion of the housing broken away. Shown in this figure are the cantilevered fingers bent in opposite directions. Particular attention should be paid to the area at which contact is broken 13 in the metallic array 8 to separate the contacts into four separate pairs. After the plastic housing has been formed and the contact fingers 2 and 3 cantilevered the contact connector 1 can be severed from the metal strip 7. However, instead of severing or singulating the connectors at this time, the housed connectors 1 still attached to the metal strip 7 can be rolled or wound onto a reel 14 as shown in FIG. 7 for delivery to a customer or to another work station for use. The ability to ship a strip of connectors on a reel offers the added advantage of allowing the customer the option of using in-house equipment that receives the reel 14 as shipped, automatically singulates (separates into a single component) and then installs the plastic housed connector 1 into an electronic appliance 17 as shown in FIG. 8. Now referring to FIG. 8 in greater detail there is shown a cross-sectional view taken along line 9—9 of FIG. 1 showing the construction of the plastic housed connector 1 in its environment of use. The housed connector 1 has been singulated and has been inserted into the receiving ports 15 on electronic device 17 employing the bottom guide post 6 and the top guide post 5 so that the contact fingers 2 and 3 make contact with pads 16 and the electronic device 17. The contact pads 16 on the electronic devices 17 sandwich the housed micro-power connector and compress the contact fingers to make electrical contact between the first and second connecting surfaces.

The plastic housed contact connector array of this invention has been shown with exposed metal at its outside edge surfaces. It is obvious that the metal connector can be manufactured so that plastic completely surrounds the outer metallic edge of the connector.

Obviously, many modifications may be made without departing from the basic spirit of the present invention. Accordingly, it will be appreciated by those skilled in the art that within the scope of the appended claims, the invention may be practiced other than has been specifically described herein.

What is claimed:

1. A contact connector array comprising:
    an array formed of a conductive material and having conductive members which are joined together;
    the members are diagonally spaced relative to each other, each member of the array is located in a respective quadrant of said array, and each member of the array includes a pair of deflectable contact points for being deflected in opposite directions relative to each other;
    and said contact connector array comprises a monolithic block of dielectric, said array of conductive material and conductive members are at least partially integrally molded in said monolithic block.

2. The contact connector array of claim 1, wherein said contact points are separated by a gap.

3. The contact connector array of claim 2, wherein said conductive members comprise an aperture for receiving said molded dielectric for bonding therewith.

4. The contact connector array of claim 3, wherein each said aperture is generally aligned with a respective said gap.

5. The contact connector array of claim 1, wherein said block comprises side surfaces, said side surfaces comprise a portion of said conductive material between two layers of said dielectric material, thereby defining a laminate structure.

6. The contact connector array of claim 1, wherein said block comprises side surfaces, and one of said side surfaces comprises a semi-circular groove formed therein which intersects at least one of said contact points and a separate portion of said conductive material.

7. The contact connector array of claim 1, wherein said block comprises at least one upwardly extending cylindrical member on a top surface thereof, and at least one downwardly extending cylindrical member on a bottom surface thereof.

* * * * *